US009502556B2

(12) United States Patent
Wu et al.

(10) Patent No.: US 9,502,556 B2
(45) Date of Patent: Nov. 22, 2016

(54) INTEGRATED FABRICATION OF SEMICONDUCTOR DEVICES

(71) Applicant: TAIWAN SEMICONDUCTOR MANUFACTURING CO., LTD., Hsinchu (TW)

(72) Inventors: Ming-Chi Wu, Kaohsiung (TW); Yu-Lung Yeh, Kaohsiung (TW); Chieh-Shuo Liang, Kaohsiung (TW); Shih-Chang Lin, Tainan (TW); Meng-Yi Wu, Tainan (TW); Hsing-Chih Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 220 days.

(21) Appl. No.: 14/321,508

(22) Filed: Jul. 1, 2014

(65) Prior Publication Data

US 2016/0005860 A1    Jan. 7, 2016

(51) Int. Cl.
| H01L 27/06 | (2006.01) |
| H01L 29/78 | (2006.01) |
| H01L 29/66 | (2006.01) |
| H01L 49/02 | (2006.01) |
| H01L 29/8605 | (2006.01) |
| H01L 21/8234 | (2006.01) |

(52) U.S. Cl.
CPC ....... *H01L 29/7833* (2013.01); *H01L 27/0629* (2013.01); *H01L 28/20* (2013.01); *H01L 29/6656* (2013.01); *H01L 29/6659* (2013.01); *H01L 29/66166* (2013.01); *H01L 29/66492* (2013.01); *H01L 29/8605* (2013.01); *H01L 21/823462* (2013.01)

(58) Field of Classification Search
CPC .................. H01L 27/0629; H01L 21/823814; H01L 27/0266; H01L 27/11526; H01L 27/11546; H01L 28/20; H01L 27/0802; H01L 29/66166; H01L 29/6656; H01L 29/6659; H01L 29/8605
See application file for complete search history.

(56) References Cited

U.S. PATENT DOCUMENTS

| 4,855,246 A | * | 8/1989 | Codella ............... H01L 29/0891 148/DIG. 140 |
| 6,359,319 B1 | * | 3/2002 | Noda ...................... H01L 27/11 257/380 |
| 6,465,315 B1 | * | 10/2002 | Yu ..................... H01L 21/26586 257/E21.336 |
| 6,730,554 B1 | * | 5/2004 | Baldwin ............. H01L 27/0629 257/E21.004 |
| 7,888,740 B2 | * | 2/2011 | Tsutsumi ........ H01L 21/823814 257/358 |
| 8,558,310 B2 | * | 10/2013 | Nandakumar .... H01L 21/26506 257/344 |
| 2002/0185682 A1 | * | 12/2002 | Nandakumar ...... H01L 29/7833 257/344 |
| 2003/0081363 A1 | * | 5/2003 | Kawashima ........ H01L 27/0266 361/56 |
| 2004/0157397 A1 | * | 8/2004 | Quek .................. H01L 29/6653 438/305 |
| 2006/0017117 A1 | * | 1/2006 | Kotani ........... H01L 21/823412 257/379 |

* cited by examiner

*Primary Examiner* — Bac Au
(74) *Attorney, Agent, or Firm* — Maschoff Brennan (57) ABSTRACT

In a method for manufacturing a semiconductor device, a substrate including a gate structure is provided. A source region and a drain region are formed at opposing sides of the gate structure and an implant region for a resistor device is formed in the substrate. Pocket implant regions are formed in the source region and the drain region. A dielectric layer is formed to cover the gate structure and the substrate. A portion of dopants in the pocket implant regions interact with portions of dopants in the source region and the drain region to form lightly doped drain regions above the pocket implant regions. A resistor region of the resistor device is defined on the implant region. A portion of the dielectric layer is removed to form a spacer on a sidewall of the gate structure and a resistor protection dielectric layer on a portion of the implant region.

20 Claims, 7 Drawing Sheets

INTEGRATED FABRICATION OF SEMICONDUCTOR DEVICES

BACKGROUND

As semiconductor technology develops, metal-oxide-semiconductor (MOS) devices have been the basic logic building blocks for integrated circuits. In addition, various passive components, such as resistor devices, capacitor devices and inductor devices, may be formed on the same semiconductor wafer with the MOS devices. In traditional MOS processes, after a source/drain (S/D) implant operation is performed, a deposition process is performed to form an oxide layer to cover the semiconductor wafer, and a photolithography process and an etching process are sequentially performed on the oxide layer to form resistor protect oxide (RPO) layers of the resistor devices.

However, while existing methods for manufacturing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a process for fabricating a resistor device, a resistor protection dielectric process is the main process for forming a dielectric layer as a protection layer for a non-silicide region. In a typical MOS process, after a spacer of a MOS device is formed, a deposition process, a photolithography process and an etching process are needed for fabricating the resistor protection dielectric layer of the resistor device. Therefore, the fabrication of the MOS device is costly and time-consuming.

Embodiments of the present disclosure are directed to providing a semiconductor device and a method for manufacturing the semiconductor device, in which a dielectric layer is formed for fabricating a spacer of an active device and a resistor protection dielectric layer of a resistor device, and a removal operation is performed on the dielectric layer to simultaneously form the spacer and the resistor protection dielectric layer, so that an extra deposition process and an extra removal process required by the conventional fabrication of the resistor protection dielectric layer can be eliminated. Furthermore, lightly doped drain regions can be formed by a pocket compensated implant process, so as to omit a lightly doped drain (LDD) implant operation. Thus, the fabrication cost is reduced and the throughput is enhanced.

Figure 1:
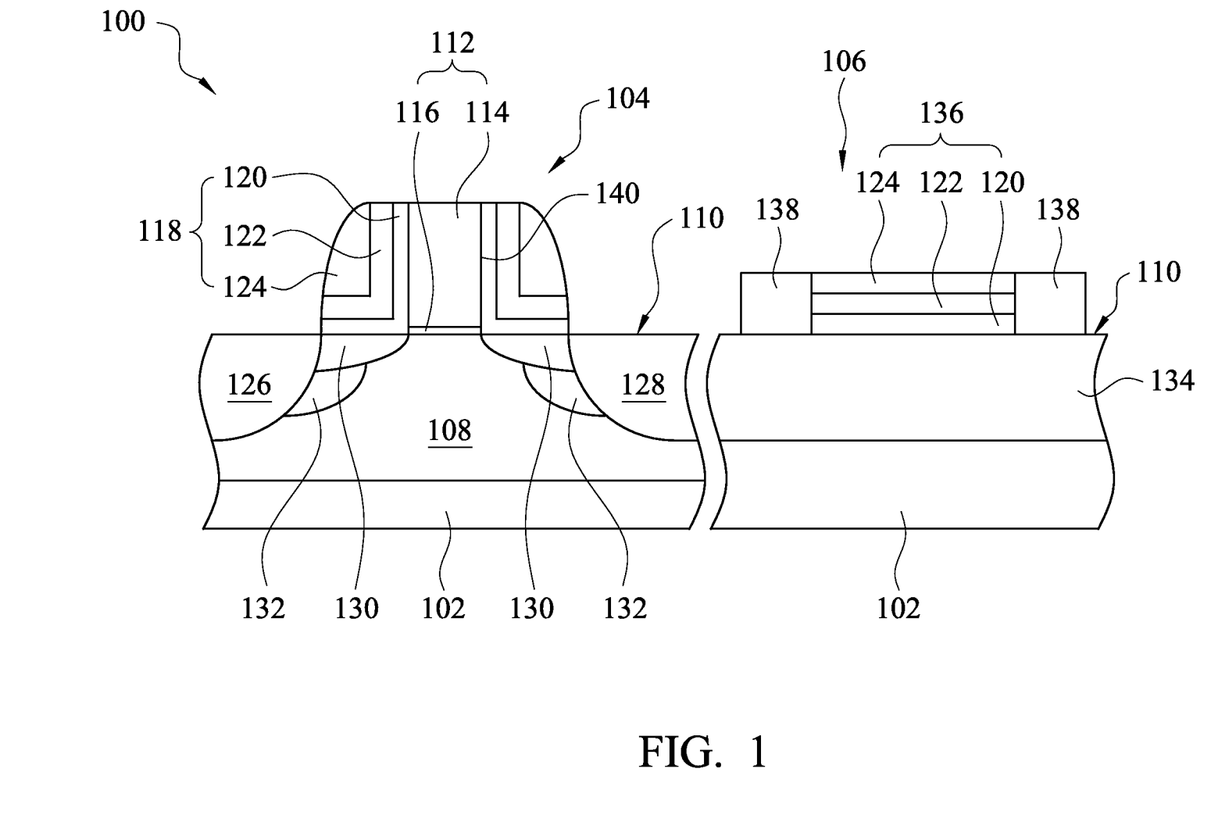
FIG. 1 is a schematic cross-sectional view of a semiconductor device in accordance with various embodiments.

FIG. 1 is schematic cross-sectional view of a semiconductor device in accordance with various embodiments. As shown in FIG. 1, a semiconductor device 100 includes a substrate 102, at least one active device 104 and at least one passive device such as a resistor device, a capacitor device and an inductor device. In some exemplary embodiments, the semiconductor device 100 includes a resistor device 106. The substrate 102 is a semiconductor substrate. The substrate 102 may be formed of a single-crystalline semiconductor material or a compound semiconductor material. For example, the substrate 102 is a silicon substrate. In some embodiments, carbon, germanium, gallium, arsenic, nitrogen, indium, phosphorus, and/or the like, may be included in the substrate 102. The substrate 102 includes a well 108. In some embodiments, the well 108 of the substrate 102 is of P type. In various embodiments, the well 108 of the substrate 102 is of N type.

In some embodiments, the active device 104 is a core device or an input/output (I/O) device. For example, the active device 104 is a MOS device, such as a MOS field effect transistor (MOSFET). In some exemplary examples, the active device 104 includes a gate structure 112, a spacer 118, a source region 126, a drain region 128, lightly doped drain regions 130 and pocket implant regions 132. In various embodiments, the gate structure 112 is disposed on a surface 110 of the substrate 102 and includes a gate dielectric layer 116 and a gate electrode 114. For example, the gate dielectric layer 116 is formed from oxide, such as silicon oxide, or a high dielectric constant (high k) dielectric material. The gate electrode 114 is stacked on the gate dielectric layer 116. The gate electrode 114 is formed from a conductive material, such as polycrystalline silicon or metal.

The spacer 118 is disposed on a sidewall 140 of the gate structure 112. The spacer 118 is formed from a dielectric layer. In some embodiments, the spacer 118 is formed from a high k dielectric layer, a nitride layer, an oxide layer or a silicon oxynitride layer. In some exemplary examples, as shown in FIG. 1, the spacer 118 includes an oxide layer 120, a nitride layer 122 and an oxide layer 124 sequentially stacked on the surface 110 of the substrate 102, i.e. the spacer 118 includes an oxide/nitride/oxide (ONO) structure. The source region 126 and the drain region 128 are formed in the well 108 of the substrate 102, and the source region 126 and the drain region 128 are disposed at opposing sides of the gate structure 112. The source region 126 and the drain region 128 are of the same conductivity type, and include the same dopant, for example. In some embodiments, the source region 126 and the drain region 128 are of N-plus type and include the dopants such as phosphorus or nitrogen, while the well 108 is of P type. In various embodiments, the source region 126 and the drain region 128 are of P-plus type and include the dopants such as boron, aluminum or gallium, while the well 108 is of N type.

The lightly doped drain regions 130 are respectively formed in the source region 126 and the drain region 128 beneath the spacer 118. In some embodiments, the lightly doped drain regions 130 are of N-minus type and include the dopants such as phosphorus or nitrogen, while the well 108 is of P type. In various embodiments, the lightly doped drain regions 130 are of P-minus type and include the dopants such as boron, aluminum or gallium, while the well 108 is of N type. The pocket implant regions 132 are respectively formed in the source region 126 and the drain region 128 beneath the lightly doped drain regions 130. In some embodiments, the pocket implant regions 132 are of P or P-minus type and include the dopants such as boron, aluminum or gallium, while the well 108 is of P type. In various embodiments, the pocket implant regions 132 are of N or N-minus type and include the dopants such as phosphorus or nitrogen, while the well 108 is of N type.

Referring to FIG. 1 again, the resistor device 106 includes an implant region 134 and a resistor protection dielectric layer 136. The implant region 134 is formed in the substrate 102. In some embodiments, the implant region 134 is formed at the same time with the source region 126 and the drain region 128. In some exemplary examples, the source region 126, the drain region 128 and the implant region 134 are formed in the substrate 102 using a source/drain implant process, so that the source region 126, the drain region 128 and the implant region 134 may include the same dopant. In some embodiments, the implant region 134 is of N-plus type and includes the dopants such as phosphorus or nitrogen, while the well 108 is of P type. In various embodiments, the implant region 134 is of P-plus type and includes the dopants such as boron, aluminum or gallium, while the well 108 is of N type.

The resistor protection dielectric layer 136 is formed on the implant region 134 at the same time with the spacer 118, and the resistor protection dielectric layer 136 and the spacer 118 are formed from the same material. In some embodiments, the resistor protection dielectric layer 136 is formed from a dielectric layer such as a high k dielectric layer, a nitride a dielectric layer, an oxide a dielectric layer or a silicon oxynitride layer. In some exemplary examples, similar to the spacer 118, the resistor protection dielectric layer 136 includes an oxide layer 120, a nitride layer 122 and an oxide layer 124 sequentially stacked on the surface 110 of the substrate 102, i.e. the resistor protection dielectric layer 136 includes an ONO structure. In some embodiments, the resistor device 106 further includes a metal layer 138 disposed on the surface 110 of the substrate 102 surrounding the resistor protection dielectric layer 136.

By using the same material to form the spacer 118 of the active device 104 and the resistor protection dielectric layer 136 of the resistor device 106, the spacer 118 and the resistor protection dielectric layer 136 can be simultaneously formed, so that the fabrications of the active device 104 and the resistor device 106 can be effectively integrated. Thus, the process of fabricating the semiconductor device 100 is simplified, thereby reducing the fabrication cost and enhancing the throughput.

Figure 2:
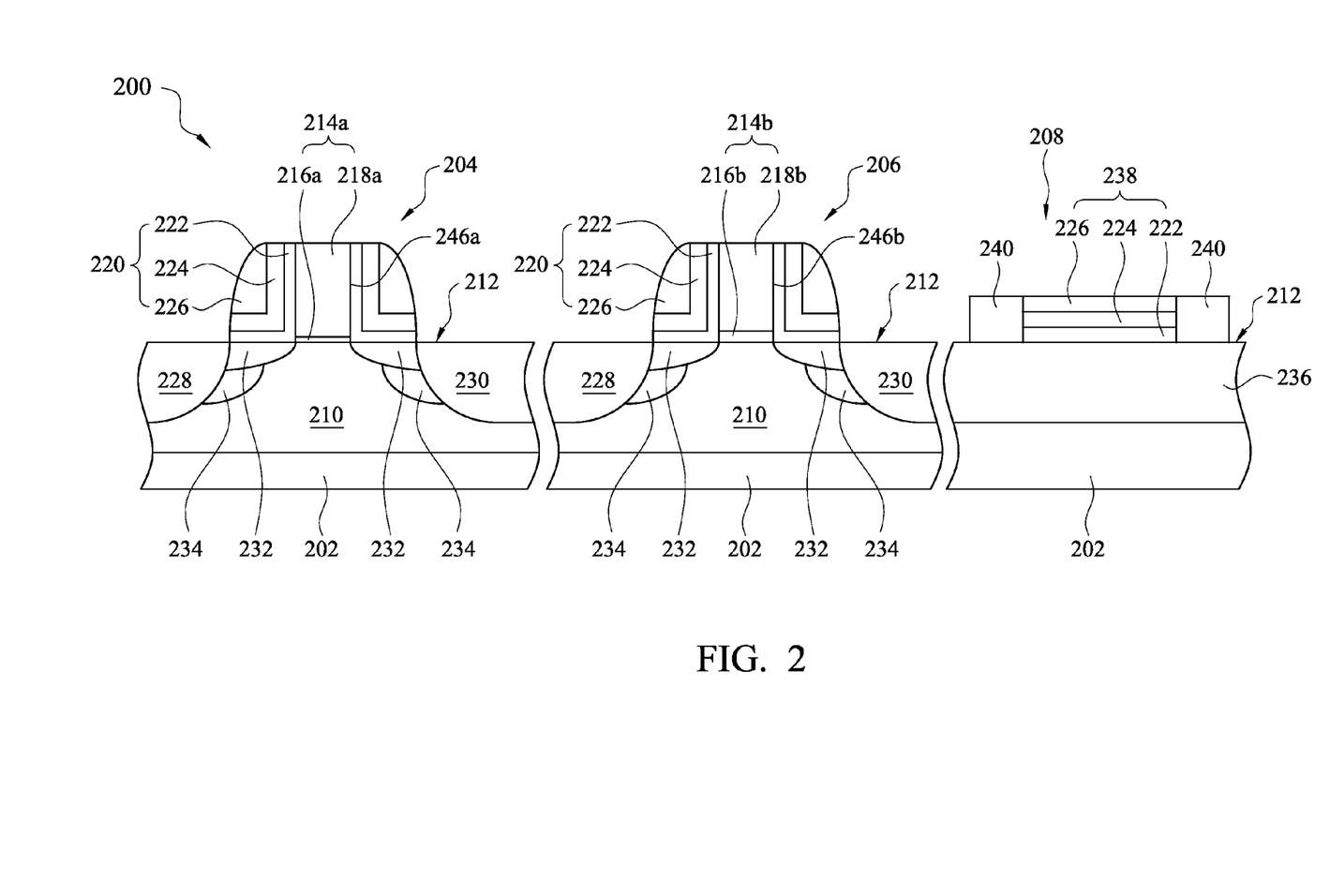
FIG. 2 is a schematic cross-sectional view of a semiconductor device in accordance with various embodiments.

FIG. 2 is schematic cross-sectional view of a semiconductor device in accordance with various embodiments. As shown in FIG. 2, a semiconductor device 200 includes a substrate 202, at least one core device 204, at least one I/O device 206 and at least one passive device, such as a resistor device, a capacitor device and an inductor device. In some exemplary embodiments, the semiconductor device 200 includes a resistor device 208. The substrate 202 is a semiconductor substrate. The substrate 202 may be formed of a single-crystalline semiconductor material or a compound semiconductor material. For example, the substrate 202 is a silicon substrate. In some embodiments, carbon, germanium, gallium, arsenic, nitrogen, indium, phosphorus, and/or the like, is also included in the substrate 202. The substrate 202 includes a well 210. In some embodiments, the well 210 is of P type. In various embodiments, the well 210 is of N type.

In some embodiments, each of the core device 204 and the I/O device 206 is a MOS device, such as a MOSFET. In some exemplary examples, the core device 204 includes a gate structure 214a, a spacer 220, a source region 228 and a drain region 230. The gate structure 214a is disposed on a surface 212 of the substrate 202. For example, the gate structure 214a includes a gate dielectric layer 216a and a gate electrode 218a. In some exemplary examples, the gate dielectric layer 216a is formed from oxide, such as silicon oxide, or a high k dielectric material. The gate electrode 218a is stacked on the gate dielectric layer 216a. The gate electrode 218a is formed from a conductive material, such as polycrystalline silicon or metal.

The spacer 220 is disposed on a sidewall 246a of the gate structure 214a. The spacer 220 is formed from a dielectric layer. In some embodiments, the spacer 220 is formed from a high k dielectric layer, a nitride layer, an oxide layer or a silicon oxynitride layer. In some exemplary examples, as shown in FIG. 2, the spacer 220 includes an ONO structure composed of an oxide layer 222, a nitride layer 224 and an oxide layer 226 sequentially stacked on the surface 212 of the substrate 202. The source region 228 and the drain region 230 are formed in the well 210, and the source region 228 and the drain region 230 are disposed at opposing sides of the gate structure 214a. For example, the source region 228 and the drain region 230 are of the same conductivity type, and include the same dopant. In some embodiments, the source region 228 and the drain region 230 are of N-plus type and include the dopants such as phosphorus or nitrogen, while the well 210 is of P type. In various embodiments, the source region 228 and the drain region 230 are of P-plus type and include the dopants such as boron, aluminum or gallium, while the well 210 is of N type.

In some embodiments, the core device 204 further includes lightly doped drain regions 232 and pocket implant regions 234. The lightly doped drain regions 232 are respectively formed in the source region 228 and the drain region 230 beneath the spacer 220. In some exemplary examples, the lightly doped drain regions 232 are of N-minus type and include the dopants such as phosphorus or nitrogen, while the well 210 is of P type. In various exemplary examples, the lightly doped drain regions 232 are of P-minus type and include the dopants such as boron, aluminum or gallium, while the well 210 is of N type. The pocket implant regions 234 are respectively formed in the source region 228 and the drain region 230 beneath the lightly doped drain regions 232. In some examples, the pocket implant regions 234 are of P type or P-minus type and include the dopants such as boron, aluminum or gallium, while the well 210 is of P type. In various examples, the pocket implant regions 234 are of N type or N-minus type and include the dopants such as phosphorus or nitrogen, while the well 210 is of N type.

In some exemplary examples, similar to the core device 204, the I/O device 206 includes a gate structure 214b, a spacer 220, a source region 228 and a drain region 230. The gate structure 214b is disposed on the surface 212 of the substrate 202. For example, the gate structure 214b includes a gate dielectric layer 216b and a gate electrode 218b. In some exemplary examples, the gate dielectric layer 216b is formed from oxide, such as silicon oxide, or a high k dielectric material. The gate electrode 218b is stacked on the gate dielectric layer 216b. The gate electrode 218b is formed from a conductive material, such as polycrystalline silicon or metal. In some exemplary examples, the gate dielectric layer 216b of the I/O device 206 is thicker than the gate dielectric layer 216a of the core device 204.

In the I/O device 206, similar to the core device 204, the spacer 220 is disposed on a sidewall 246b of the gate structure 214b. The spacer 220 is formed from a dielectric layer such as a high k dielectric layer, a nitride layer, an oxide layer or a silicon oxynitride layer. In some exemplary examples, the spacer 220 includes an ONO structure composed of an oxide layer 222, a nitride layer 224 and an oxide layer 226 sequentially stacked on the surface 212 of the substrate 202. The source region 228 and the drain region 230 are formed in the well 210, and the source region 228 and the drain region 230 are disposed at opposing sides of the gate structure 214b. For example, the source region 228 and the drain region 230 in the I/O device 206 are of the same conductivity type, and include the same dopant. Furthermore, the source region 228 and the drain region 230 in the core device 204 and the source region 228 and the drain region 230 in the I/O device 206 include the same dopant. In some embodiments, the source region 228 and the drain region 230 are of N-plus type and include the dopants such as phosphorus or nitrogen, while the well 210 is of P type. In various embodiments, the source region 228 and the drain region 230 are of P-plus type and include the dopants such as boron, aluminum or gallium, while the well 210 is of N type.

In some embodiments, the I/O device 206 further includes lightly doped drain regions 232 and pocket implant regions 234. The lightly doped drain regions 232 are respectively formed in the source region 228 and the drain region 230 beneath the spacer 220. In some exemplary examples, the lightly doped drain regions 232 are of N-minus type and include the dopants such as phosphorus or nitrogen, while the well 210 is of P type. In various exemplary examples, the lightly doped drain regions 232 are of P-minus type and include the dopants such as boron, aluminum or gallium, while the well 210 is of N type. The pocket implant regions 234 are respectively formed in the source region 228 and the drain region 230 beneath the lightly doped drain regions 232. In some examples, the pocket implant regions 234 are of P type or P-minus type and include the dopants such as boron, aluminum or gallium, while the well 210 is of P type. In various examples, the pocket implant regions 234 are of N type or N-minus type and include the dopants such as phosphorus or nitrogen, while the well 210 is of N type.

Referring to FIG. 2 again, the resistor device 208 including an implant region 236 and a resistor protection dielectric layer 238. The implant region 236 is formed in the substrate 202. In some embodiments, the implant region 236 is formed at the same time with the source region 228 and the drain region 230. In some exemplary examples, the source region 228 and the drain region 230 of the core device 204, the source region 228 and the drain region 230 of the I/O device 206, and the implant region 236 are formed in the substrate 202 using a source/drain implant process, so that the source region 228 and the drain region 230 of the core device 204, the source region 228 and the drain region 230 of the I/O device 206, and the implant region 236 may include the same dopant. In some embodiments, the implant region 236 is of N-plus type and includes the dopants such as phosphorus or nitrogen, while the well 210 is of P type. In various embodiments, the implant region 236 is of P-plus type and includes the dopants such as boron, aluminum or gallium, while the well 210 is of N type.

The resistor protection dielectric layer 238 is formed on the implant region 236 at the same time with the spacers 220 of the core device 204 and the I/O device 206, and the resistor protection dielectric layer 238 and the spacers 220 are formed from the same material. In some embodiments, the resistor protection dielectric layer 238 is formed from a dielectric layer such as a high k dielectric layer, a nitride layer, an oxide layer or a silicon oxynitride layer. In some exemplary examples, similar to the spacers 220 of the core device 204 and the I/O device 206, the resistor protection dielectric layer 238 includes an ONO structure composed of an oxide layer 222, a nitride layer 224 and an oxide layer 226 sequentially stacked on the surface 212 of the substrate 202. In some embodiments, the resistor device 208 further includes a metal layer 240 disposed on the surface 212 of the substrate 202 surrounding the resistor protection dielectric layer 238.

Figure 3A:
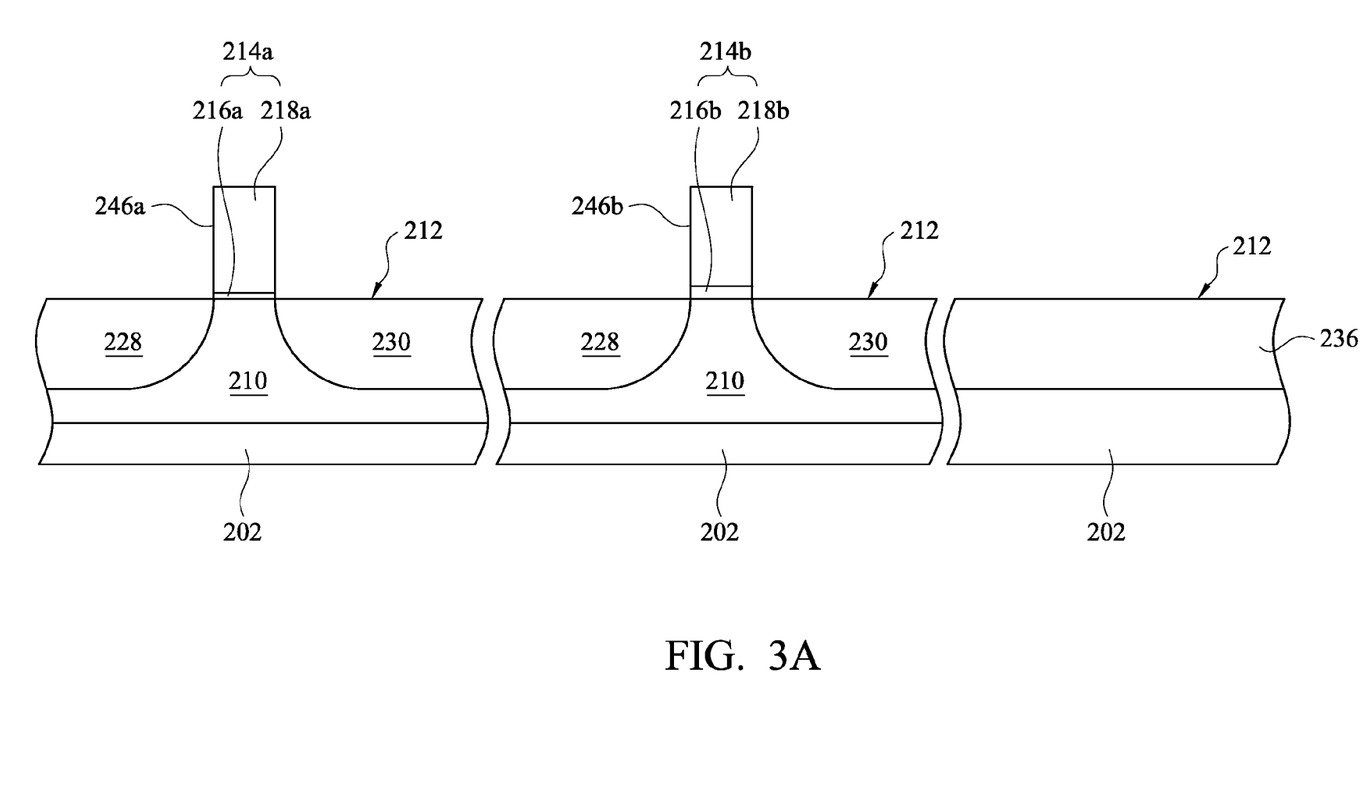
FIG. 3A through FIG. 3D are schematic cross-sectional views of intermediate stages showing a method for manufacturing a semiconductor device in accordance with various embodiments.

FIG. 3A through FIG. 3D are schematic cross-sectional views of intermediate stages showing a method for manufacturing a semiconductor device in accordance with various embodiments. As shown in FIG. 3A, a substrate 202 is provided. The substrate 202 is a semiconductor substrate, and may be formed of a single-crystalline semiconductor material or a compound semiconductor material, for example. In certain embodiments, the substrate 202 is a silicon substrate. In some embodiments, carbon, germanium, gallium, arsenic, nitrogen, indium, phosphorus, and/or the like, is also included in the substrate 202. In the operation of providing the substrate 202, a well 210 is formed in the substrate 202 using an implant process with dopants. In some embodiments, the well 210 is formed using P type dopants to become P type. In various embodiments, the well 210 is formed using N type dopants to become N type.

In some embodiments, a gate structure 214a is formed on a surface 212 of the substrate 202, in which the gate structure 214a has a sidewall 246a. In various embodiments, as shown in FIG. 3A, a gate structure 214b is also formed on the surface 212, in which the gate structure 214b has a sidewall 246b. For example, the operation of forming the gate structure 214a is performed to form a gate dielectric layer 216a on the surface 212 and to stack a gate electrode 218a on the gate dielectric layer 216a, and the operation of forming the gate structure 214b is performed to form a gate dielectric layer 216b on the surface 212 and to stack a gate electrode 218b on the gate dielectric layer 216b. The gate dielectric layer 216b is thicker than the gate dielectric layer 216a. In some exemplary examples, each of the gate dielectric layers 216a and 216b is formed from oxide, such as silicon oxide, or a high k dielectric material. In addition, each of the gate electrodes 218a and 218b is formed from a conductive material, such as polycrystalline silicon or metal.

In some embodiments, a source/drain implant operation is performed to form a source region 228 and a drain region 230 at opposing sides of the gate structure 214a and an implant region 236 for a resistor device 208 (referring to FIG. 3D) in the substrate 202. In certain embodiments, as shown in FIG. 3A, the source/drain implant operation is performed to form the source region 228 and the drain region 230 at opposing sides of the gate structure 214a, a source region 228 and a drain region 230 at opposing sides of the gate structure 214b, and the implant region 236 for the resistor device 208 in the substrate 202. In some exemplary examples, the source/drain implant operation is performed with N type dopants such as phosphorus or nitrogen, to form the source regions 228, the drain regions 230 and the implant region 236 which are of N-plus type while the well 210 is of P type. In various exemplary examples, the source/drain implant operation is performed with P type dopants such as boron, aluminum or gallium, to form the source regions 228, the drain regions 230 and the implant region 236 which are of P-plus type while the well 210 is of N type.

Figure 3B:
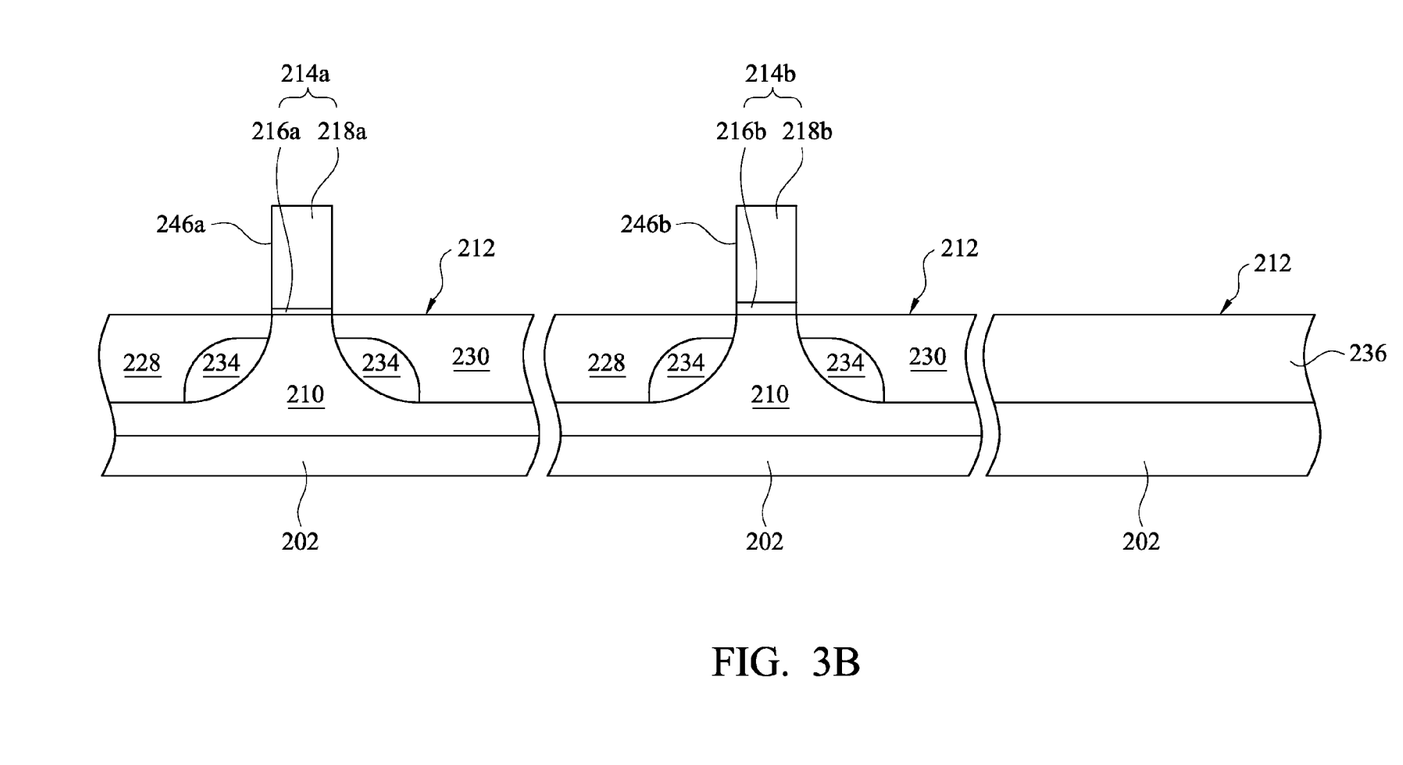

In some embodiments, pocket implant regions 234 are formed respectively in the source region 228 and the drain region 230 at opposing sides of the gate structure 214a using an implant technique with the implant region 236 being masked, for example. In certain embodiments, as shown in FIG. 3B, pocket implant regions 234 are formed respectively in the source region 228 and the drain region 230 at opposing sides of the gate structure 214b are formed while the pocket implant regions 234 are formed respectively at opposing sides of the gate structure 214a. In some exemplary examples, the operation of forming the pocket implant regions 234 is performed with P type dopants such as boron, aluminum or gallium, to form the pocket implant regions 234 of P-plus type while the well 210 is of P type. In various exemplary examples, the operation of forming the pocket implant regions 234 is performed with N type dopants such as phosphorus or nitrogen, to form the pocket implant regions 234 of N-plus type while the well 210 is of N type.

Figure 3C:
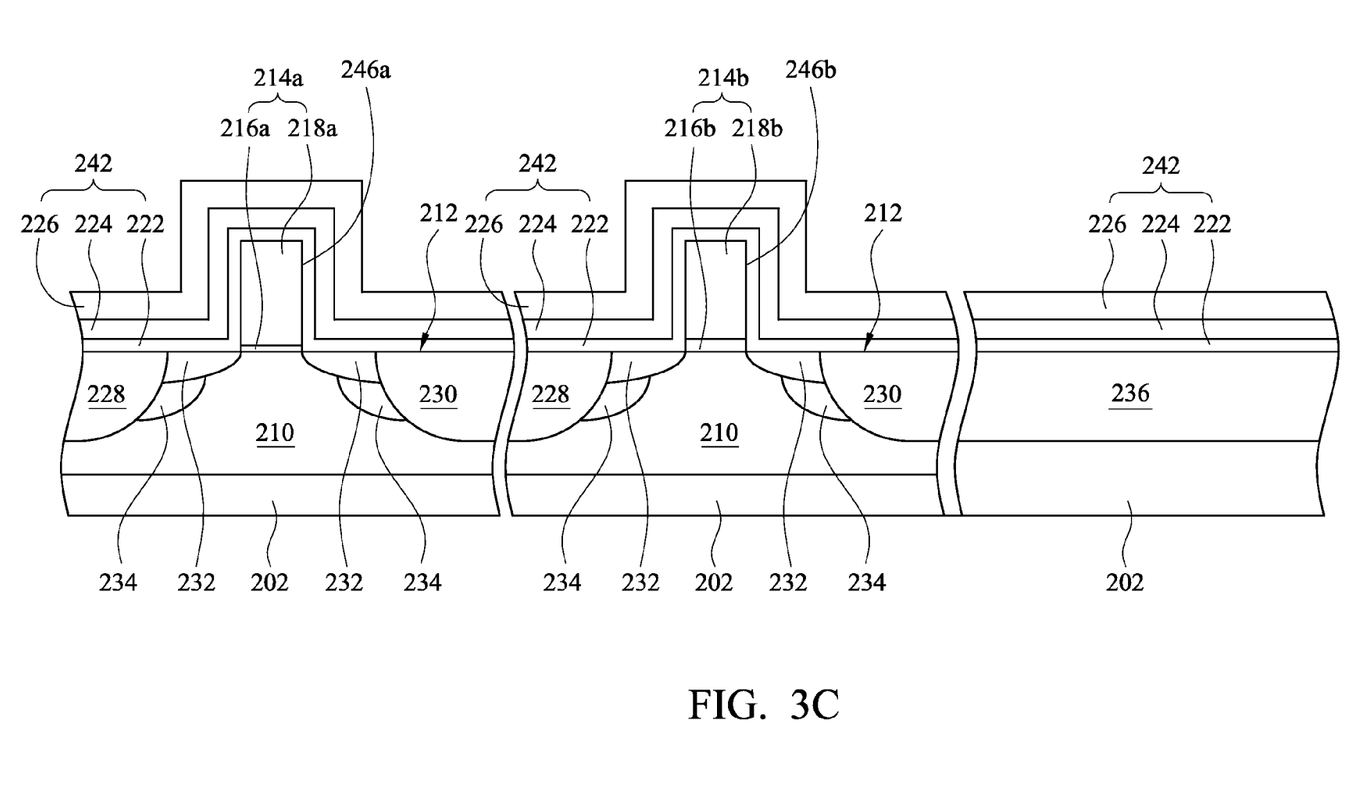

In some embodiments, a dielectric layer 242 is formed to cover the gate structure 214a and the surface 212 of the substrate 202 using a deposition process, such as a chemical vapor deposition (CVD) process. In certain embodiments, as shown in FIG. 3C, the dielectric layer 242 is formed to cover the gate structures 214a and 214b, and the surface 212 of the substrate 202. In some examples, the operation of forming the dielectric layer 242 is performed to form the dielectric layer 242 from high k dielectric, nitride, oxide or silicon oxynitride. In certain examples, the operation of forming the dielectric layer 242 is performed to form the dielectric layer 242 including an ONO structure composed of an oxide layer 222, a nitride layer 224 and an oxide layer 226 sequentially stacked on the surface 212 of the substrate 202.

After the dielectric layer 242 is formed, a heat treatment operation is performed using a rapid thermal anneal (RTA) technique, for examples. In the heat treatment operation, the dopants in the source regions 228, the drain regions 230, the pocket implant regions 234 and the implant region 236 are activated, and a portion of dopants in the pocket implant regions 234 interact with portions of dopants in the source regions 228 and the drain regions 230, so as to form lightly doped drain regions 232 above the pocket implant regions 234 in the source regions 228 and the drain regions 230 respectively. In some exemplary examples, the heat treatment operation is performed to form the lightly doped drain regions 232 of N-minus type and to convert the pocket implant regions 234 from P-plus type to P type or P-minus type, while the well 210 is of P type. In various exemplary examples, the heat treatment operation is performed to form the lightly doped drain regions 232 of P-minus type and to convert the pocket implant regions 234 from N-plus type to N type or N-minus type, while the well 210 is of N type.

The lightly doped drain regions 232 can be formed via the interaction between the dopants in the source regions 228/ the drain regions 230 and the dopants in the pocket implant regions 234 during the heat treatment operation, and thus no extra implant operation is required for the lightly doped drain regions 232. Therefore, the fabrication is simplified, and the fabrication cost is reduced. In addition, with the dielectric layer 242 covering the source regions 228, the drain regions 230, the pocket implant regions 234 and the implant region 236, the dopants in the source regions 228, the drain regions 230, the pocket implant regions 234 and the implant region 236 can be prevented from diffusing upwardly during the heat treatment operation.

After the heat treatment operation is performed, a resistor region 244 of the resistor device 208 is defined using, for example, a photolithography process to locally mask the dielectric layer 242 on the implant region 236. For example, a hard mask, such as a photoresist layer, is formed to cover the dielectric layer 242, an exposure operation is performed on the hard mask, and a development operation is performed to remove a portion of the hard mask and remain the other portion of the hard mask masking the dielectric layer 242 on the implant region 236 in the resistor region 244. The remaining portion of the hard mask defines the resistor region 244.

Figure 3D:
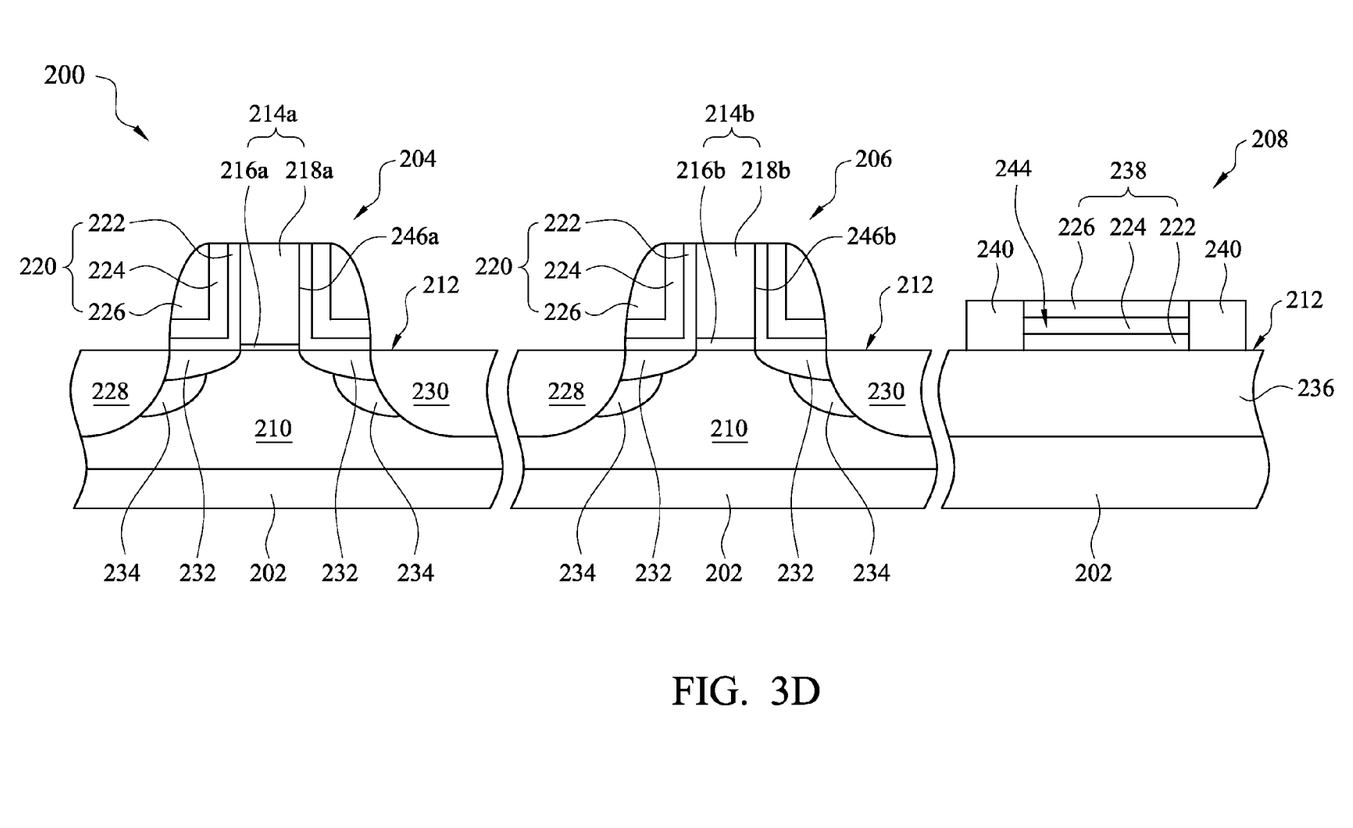

In some embodiments, as shown in FIG. 3C and FIG. 3D, a portion of the dielectric layer 242 is removed to form a spacer 220 on the sidewall 246a of the gate structure 214a and a resistor protection dielectric layer 238 on the implant region 236 in the resistor region 244, while the dielectric layer 242 is locally masked. In certain embodiments, as shown in FIG. 3D, the operation of removing the portion of the dielectric layer 242 is performed to form a spacer 220 on the sidewall 246b of the gate structure 214b, so as to substantially complete the fabrication of a core device 204, an I/O device 206 and the resistor device 208. In some exemplary examples, the operation of removing the portion of the dielectric layer 242 is performed using an etching technique, such as a dry etching technique. After the resistor protection dielectric layer 238 is formed, a metal layer 240 is formed on the surface 212 of the substrate 202 to surround the resistor protection dielectric layer 238.

Due to the lightly doped drain regions 232 are formed via the interaction between the dopants in the source regions 228/the drain regions 230 and the dopants in the pocket implant regions 234 during the heat treatment operation, the spacers 220 of the core device 204 and the I/O device 206 and the resistor protection dielectric layer 238 of the resistor device 208 can be simultaneously formed. Thus, an extra deposition process and an extra removal process such as an etching process for the conventional process can be omitted, thereby reducing the fabrication cost and enhancing the throughput.

Figure 4:
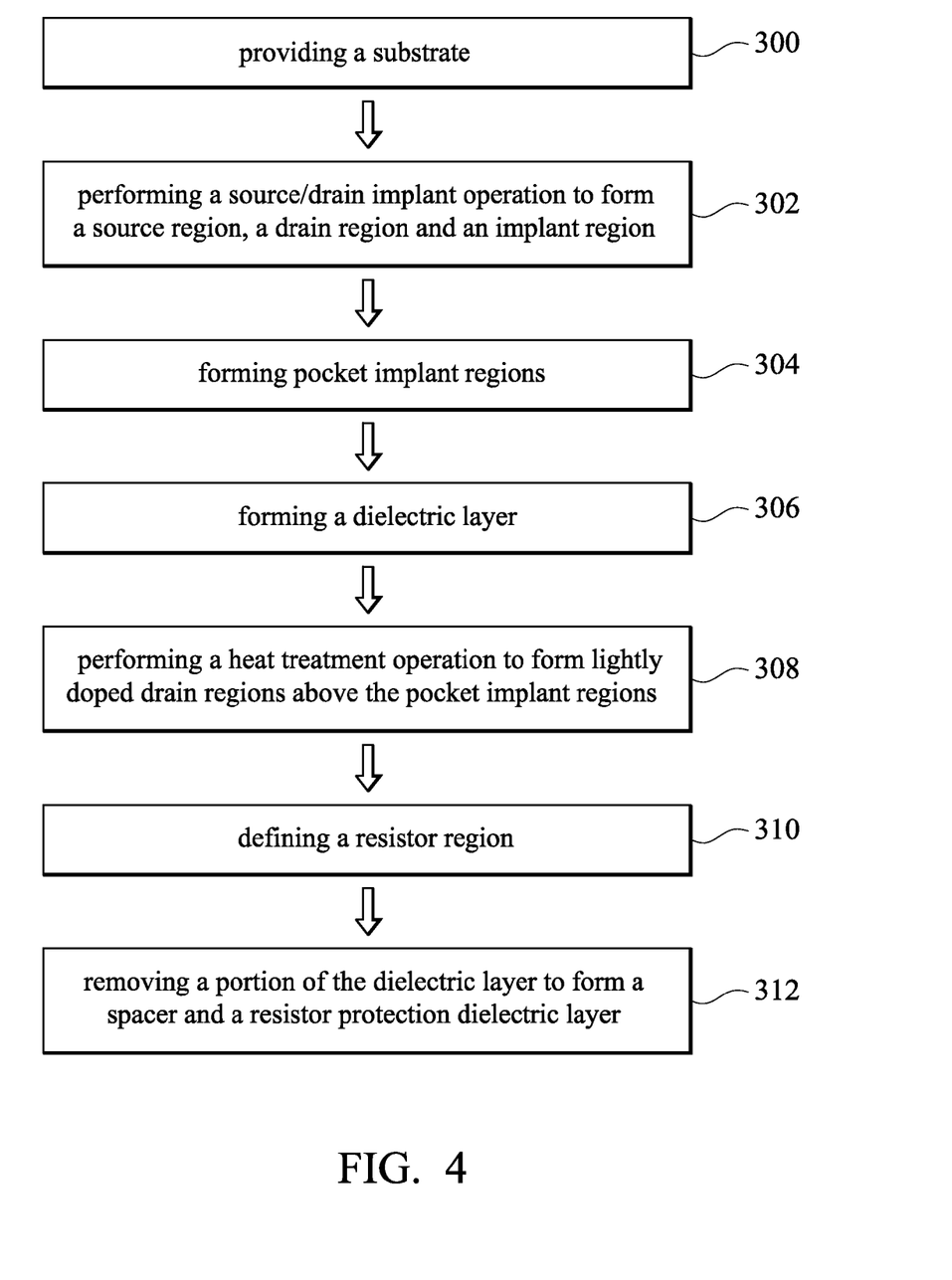
FIG. 4 is a flow chart of a method for manufacturing a semiconductor device in accordance with various embodiments.

Referring to FIG. 4 with FIG. 3A through FIG. 3D, FIG. 4 is a flow chart of a method for manufacturing a semiconductor device in accordance with various embodiments. The method begins at operation 300, where a substrate 202 is provided. In the operation 300 of providing the substrate 202, a well 210 is formed in the substrate 202 using an implant process with dopants. In some embodiments, the well 210 is formed using P type dopants to become P type. In various embodiments, the well 210 is formed using N type dopants to become N type.

In some embodiments, the operation 300 is performed to further form a gate structure 214a having a sidewall 246a on a surface 212 of the substrate 202. In various embodiments, as shown in FIG. 3A, the operation 300 is performed to further form a gate structure 214b having a sidewall 246b on the surface 212. For example, the operation of forming the gate structure 214a is performed to sequentially form a gate dielectric layer 216a and a gate electrode 218a on the surface 212, and the operation of forming the gate structure 214b is performed to sequentially form a gate dielectric layer 216b on the surface 212 and a gate electrode 218b on the surface 212. The gate dielectric layer 216b is thicker than the gate dielectric layer 216a.

At operation 302, a source/drain implant operation is performed to form a source region 228 and a drain region 230 at opposing sides of the gate structure 214a and an implant region 236 for a resistor device 208 (referring to FIG. 3D) in the substrate 202. In certain embodiments, as shown in FIG. 3A, the source/drain implant operation is performed to further form a source region 228 and a drain region 230 at opposing sides of the gate structure 214b. In some exemplary examples, the source/drain implant operation is performed to form the source regions 228, the drain regions 230 and the implant region 236 which are of N-plus type, while the well 210 is of P type. In various exemplary examples, the source/drain implant operation is performed to form the source regions 228, the drain regions 230 and the implant region 236 which are of P-plus type, while the well 210 is of N type.

At operation 304, pocket implant regions 234 are formed respectively in the source region 228 and the drain region 230 at opposing sides of the gate structure 214a using, for example, an implant technique while the implant region 236 is masked. In certain embodiments, as shown in FIG. 3B, the operation 304 is performed to further form pocket implant regions 234 respectively in the source region 228 and the drain region 230 at opposing sides of the gate structure 214b. In some exemplary examples, the operation 304 is performed to form the pocket implant regions 234 of P-plus type, while the well 210 is of P type. In various exemplary examples, the operation 304 is performed to form the pocket implant regions 234 of N-plus type, while the well 210 is of N type.

At operation 306, a dielectric layer 242 is formed to cover the gate structure 214a and the surface 212 of the substrate 202 using a deposition process. In certain embodiments, as shown in FIG. 3C, the operation 306 is performed to form the dielectric layer to further cover the gate structure 214b. In some examples, the operation of forming the dielectric layer 242 is performed to form the dielectric layer 242 from high k dielectric, nitride, oxide or silicon oxynitride. In certain examples, the operation of forming the dielectric layer 24 is performed to form the dielectric layer including an ONO structure composed of an oxide layer 222, a nitride layer 224 and an oxide layer 226 sequentially stacked on the surface 212 of the substrate 202.

At operation 308, a heat treatment operation is performed using a rapid thermal anneal technique, for examples. In the heat treatment operation, the dopants in the source regions 228, the drain regions 230, the pocket implant regions 234 and the implant region 236 are activated, and a portion of dopants in the pocket implant regions 234 interact with portions of dopants in the source regions 228 and the drain regions 230, so as to form lightly doped drain regions 232 respectively above the pocket implant regions 234 in the source regions 228 and the drain regions 230, as shown in FIG. 3C. In some exemplary examples, the heat treatment operation is performed to form the lightly doped drain regions 232 of N-minus type and to convert the pocket implant regions 234 from P-plus type to P type or P-minus type, while the well 210 is of P type. In various exemplary examples, the heat treatment operation is performed to form the lightly doped drain regions 232 of P-minus type and to convert the pocket implant regions 234 from N-plus type to N type or N-minus type, while the well 210 is of N type.

At operation 310, a resistor region 244 of the resistor device 208 is defined using, for example, a photolithography process to locally mask the dielectric layer 242 on the implant region 236. At operation 312, a portion of the dielectric layer 242 is removed to form a spacer 220 on the sidewall 246a of the gate structure 214a and a resistor protection dielectric layer 238 on the implant region 236 in the resistor region 244. In certain embodiments, as shown in FIG. 3D, the operation 310 is performed to further form a spacer 220 on the sidewall 246b of the gate structure 214b, so that the fabrication of a core device 204, an I/O device 206 and the resistor device 208 is substantially completed. In some exemplary examples, the operation 310 is performed using an etching technique, such as a dry etching technique. After the resistor protection dielectric layer 238 is formed, a metal layer 240 is formed on the surface 212 of the substrate 202 to surround the resistor protection dielectric layer 238.

In accordance with an embodiment, the present disclosure discloses a method for manufacturing a semiconductor device. In this method, a substrate including a gate structure is provided. A source/drain implant operation is performed to form a source region and a drain region at opposing sides of the gate structure and an implant region for a resistor device in the substrate. Pocket implant regions are respectively formed in the source region and the drain region. A dielectric layer is formed to cover the gate structure and the substrate. A heat treatment operation is performed, in which a portion of dopants in the pocket implant regions interact with portions of dopants in the source region and the drain region to form lightly doped drain regions above the pocket implant regions. A resistor region of the resistor device is defined by locally masking the dielectric layer on the implant region. A portion of the dielectric layer is removed to form a spacer on a sidewall of the gate structure and a resistor protection dielectric layer on a portion of the implant region.

In accordance with another embodiment, the present disclosure discloses a semiconductor device. The semiconductor device includes a substrate, an active device and a resistor device. The active device includes a gate structure, a spacer, a source region, a drain region, lightly doped drain regions and pocket implant regions. The gate structure is disposed on the substrate. The spacer is disposed on a sidewall of the gate structure. The source region and the drain region are disposed at opposing sides of the gate structure in the substrate. The lightly doped drain regions are respectively disposed in the source region and the drain region beneath the spacer. The pocket implant regions are respectively disposed in the source region and the drain region beneath the lightly doped drain regions. The resistor device includes an implant region and a resistor protection dielectric layer. The implant region is disposed in the substrate. The resistor protection dielectric layer is disposed on the implant region, in which the resistor protection dielectric layer and the spacer are formed from the same material.

In accordance with yet another embodiment, the present disclosure discloses a semiconductor device. The semiconductor device includes a substrate, a core device, an I/O device and a resistor device. The core device includes a first gate structure, a first spacer, a first source region and a first drain region. The first gate structure is disposed on the substrate. The first spacer is disposed on a sidewall of the first gate structure. The first source region and the first drain region are disposed at opposing sides of the first gate structure in the substrate. The I/O device includes a second gate structure, a second spacer, a second source region and a second drain region. The second gate structure is disposed on the substrate. The second spacer is disposed on a sidewall of the second gate structure. The second source region and the second drain region are disposed at opposing sides of the second gate structure in the substrate, in which the first source region, the first drain region, the second source region and the second drain region include the same dopant. The resistor device includes an implant region and a resistor protection dielectric layer. The implant region is disposed in the substrate. The resistor protection dielectric layer is disposed on the implant region, in which the resistor protection dielectric layer, the first spacer and the second spacer are formed from the same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   providing a substrate comprising a gate structure;
   performing a source/drain implant operation to form a source region and a drain region at opposing sides of the gate structure and an implant region for a resistor device in the substrate;
   forming a plurality of pocket implant regions respectively in the source region and the drain region;
   forming a dielectric layer to cover the gate structure and the substrate;
   performing a heat treatment operation in which a portion of dopants in the pocket implant regions interact with portions of dopants in the source region and the drain region to form a plurality of lightly doped drain regions above the pocket implant regions;
   defining a resistor region of the resistor device by locally masking the dielectric layer on the implant region; and
   removing a portion of the dielectric layer to form a spacer on a sidewall of the gate structure and a resistor protection dielectric layer on a portion of the implant region.

2. The method of claim 1, wherein
   the operation of providing the substrate comprises providing the substrate comprising a P type well;
   the source/drain implant operation is performed to form the source region, the drain region and the implant region which are of N-plus type; and
   the operation of forming the pocket implant regions comprises forming the pocket implant regions of P-plus type.

3. The method of claim 2, wherein the operation of forming the lightly doped drain regions comprises forming the lightly doped drain regions of N-minus type.

4. The method of claim 1, wherein
   the operation of providing the substrate comprises providing the substrate comprising an N type well;
   the source/drain implant operation is performed to form the source region, the drain region and the implant region which are of P-plus type; and
   the operation of forming the pocket implant regions comprises forming the pocket implant regions of N-plus type.

5. The method of claim 4, wherein the operation of forming the lightly doped drain regions comprises forming the lightly doped drain regions of P-minus type.

6. The method of claim 1, wherein the operation of forming the dielectric layer comprises forming the dielectric layer comprising a first oxide layer, a nitride layer and a second oxide layer which are sequentially stacked.

7. The method of claim 1, wherein the heat treatment operation is performed using a rapid thermal annealing process.

8. A semiconductor device, comprising:
   a substrate;
   an active device comprising:
     a gate structure on the substrate;
     a spacer on a sidewall of the gate structure;
     a source region and a drain region at opposing sides of the gate structure in the substrate;
     a plurality of lightly doped drain regions respectively in the source region and the drain region beneath the spacer; and
     a plurality of pocket implant regions respectively in the source region and the drain region beneath the lightly doped drain regions; and
   a resistor device comprising:
     an implant region in the substrate;
     a resistor protection dielectric layer on the implant region, wherein the resistor protection dielectric layer and the spacer are formed from the same material; and
     a metal layer on the substrate and enclosing a sidewall of the resistor protection dielectric layer.

9. The semiconductor device of claim 8, wherein each of the spacer and the resistor protection dielectric layer comprises a first oxide layer, a nitride layer and a second oxide layer which are sequentially stacked.

10. The semiconductor device of claim 8, wherein the source region, the drain region and the implant region comprise the same dopant.

11. The semiconductor device of claim 8, wherein
    the substrate comprises a P type well;
    the source region, the drain region and the implant region are of N-plus type;
    the pocket implant regions are of P type or P-minus type; and
    the lightly doped drain regions are of N-minus type.

12. The semiconductor device of claim 8, wherein
    the substrate comprises an N type well;
    the source region, the drain region and the implant region are of P-plus type;
    the pocket implant regions are of N type or N-minus type; and
    the lightly doped drain regions are of P-minus type.

13. The semiconductor device of claim 8, wherein the gate structure comprises a gate dielectric layer and a gate electrode which are sequentially stacked on the substrate.

14. A semiconductor device, comprising:
    a substrate;
    a core device, comprising:
      a first gate structure on the substrate;
      a first spacer on a sidewall of the first gate structure; and a first source region and a first drain region at opposing sides of the first gate structure in the substrate;
an I/O device comprising:
  a second gate structure on the substrate;
  a second spacer on a sidewall of the second gate structure; and
  a second source region and a second drain region at opposing sides of the second gate structure in the substrate, wherein the first source region, the first drain region, the second source region and the second drain region comprise the same dopant; and
a resistor device, comprising:
  an implant region in the substrate;
  a resistor protection dielectric layer on the implant region, wherein the resistor protection dielectric layer the first spacer and the second spacer are formed from the same material; and
  a metal layer on the substrate and enclosing a sidewall of the resistor protection dielectric layer.

15. The semiconductor device of claim 14, wherein each of the first spacer, the second spacer and the resistor protection dielectric layer comprises a first oxide layer, a nitride layer and a second oxide layer which are sequentially stacked.

16. The semiconductor device of claim 14, wherein the first source region, the first drain region, the second source region, the second drain region and the implant region comprise the same dopant.

17. The semiconductor device of claim 14, wherein the core device further comprises:
  a plurality of first lightly doped drain regions respectively in the first source region and the first drain region beneath the first spacer; and
  a plurality of first pocket implant regions respectively in the first source region and the first drain region beneath the first lightly doped drain regions; and the I/O device further comprises:
  a plurality of second lightly doped drain regions respectively in the second source region and the second drain region beneath the second spacer; and
  a plurality of second pocket implant regions respectively in the second source region and the second drain region beneath the second lightly doped drain regions.

18. The semiconductor device of claim 17, wherein
the substrate comprises a P type well;
the first source region, the first drain region, the second source region, the second drain region and the implant region are of N-plus type;
the first pocket implant regions and the second pocket implant regions are of P type or P-minus type; and
the first lightly doped drain regions and the second lightly doped drain regions are of N-minus type.

19. The semiconductor device of claim 17, wherein
the substrate comprises an N type well;
the first source region, the first drain region, the second source region, the second drain region and the implant region are of P-plus type;
the first pocket implant regions and the second pocket implant regions are of N type or N-minus type; and
the first lightly doped drain regions and the second lightly doped drain regions are of P-minus type.

20. The semiconductor device of claim 14, wherein the first gate structure comprises a first gate dielectric layer and a first gate electrode which are sequentially stacked on the substrate, and the second gate structure comprises a second gate dielectric layer and a second gate electrode which are sequentially stacked on the substrate.

* * * * *